US006806727B2

United States Patent
Thibedeau et al.

(10) Patent No.: US 6,806,727 B2
(45) Date of Patent: Oct. 19, 2004

(54) ALTERNATOR TESTING METHOD AND SYSTEM USING RIPPLE DETECTION

(75) Inventors: Dennis G. Thibedeau, Franklin, WI (US); Richard J. Faehnrich, Arlington Heights, IL (US); Alejandro P. Brott, Chicago, IL (US); Alan D. Goetzelmann, Wheeling, IL (US); Paul A. Willems, Kenosha, WI (US)

(73) Assignee: Snap-On Incorporated, Lincolnshire, IL (US)

( * ) Notice: Subject to any disclaimer, the term of this patent is extended or adjusted under 35 U.S.C. 154(b) by 0 days.

(21) Appl. No.: 09/888,385

(22) Filed: Jun. 26, 2001

(65) Prior Publication Data

US 2001/0054890 A1 Dec. 27, 2001

Related U.S. Application Data

(60) Provisional application No. 60/214,254, filed on Jun. 26, 2000.

(51) Int. Cl.$^7$ .............................................. G01R 31/34
(52) U.S. Cl. ....................................................... 324/772
(58) Field of Search ............................... 324/76.41, 73, 324/426–430, 772; 320/28, 64, 68, 134, 139; 322/28, 99; 123/179.1, 334

(56) References Cited

U.S. PATENT DOCUMENTS

| | | | |
|---|---|---|---|
| 3,629,704 A | 12/1971 | Stevens | 324/158 |
| 4,178,546 A | 12/1979 | Hulls et al. | 324/158 |
| 4,242,674 A | 12/1980 | Wheeler | 340/635 |
| 4,315,204 A | 2/1982 | Sievers et al. | 322/28 |
| 4,379,990 A | 4/1983 | Sievers et al. | |
| 4,423,378 A | 12/1983 | Marino et al. | 324/427 |
| 4,459,548 A | 7/1984 | Lentz et al. | 324/158 |
| 4,517,833 A | 5/1985 | Wesley | 73/119 |
| 4,686,445 A | 8/1987 | Phillips | 320/61 |
| 4,914,387 A | 4/1990 | Santos | 3/487 |
| 5,004,979 A | 4/1991 | Marino et al. | |
| 5,046,867 A | 9/1991 | Hilby et al. | 384/448 |
| 5,127,747 A | 7/1992 | Hilby et al. | 384/448 |
| 5,151,647 A | 9/1992 | Frantz | |
| 5,221,886 A | 6/1993 | Pierret et al. | 322/28 |
| 5,233,285 A | 8/1993 | Pierret et al. | 320/28 |
| 5,296,997 A | 3/1994 | Betton et al. | 361/92 |
| 5,450,008 A | 9/1995 | Good et al. | 324/166 |
| 5,477,142 A | 12/1995 | Good et al. | 324/166 |

(List continued on next page.)

FOREIGN PATENT DOCUMENTS

| | | |
|---|---|---|
| EP | 0 408 877 B1 | 1/1991 |
| EP | 0545 617 A1 | 6/1993 |
| EP | 0 591 871 A1 | 4/1994 |
| EP | 0 733 791 A | 9/1996 |
| EP | 0 865 143 A2 | 9/1998 |
| EP | 1035533 A2 | 9/2000 |
| GB | 2341691 A | 3/2000 |
| JP | 2-35368 | 2/1990 |

Primary Examiner—N. Le
Assistant Examiner—Amy He
(74) Attorney, Agent, or Firm—McDermott Will & Emery LLP

(57) ABSTRACT

A method and system for evaluating the operation of an alternator based on a frequency component in the alternator output signal. The method detects a frequency component of the alternator output signal, and compares the frequency component of the alternator output signal with a threshold frequency. The operation of the alternator is evaluated based on a result of the comparison. If the frequency component of the alternator output signal is lower than the threshold frequency, the alternator is determined as defective. The frequency component can be obtained by comparing the alternator output signal with an adaptive threshold. The adaptive threshold is generated based on the peak signal level and the valley signal level of the alternator output signal, such as the average of the peak signal level and valley signal level.

30 Claims, 6 Drawing Sheets

U.S. PATENT DOCUMENTS

| | | |
|---|---|---|
| 5,497,084 A | 3/1996 | Bicking .................. 324/207 |
| 5,510,706 A | 4/1996 | Good ..................... 324/166 |
| 5,524,480 A | 6/1996 | Schlienz et al. |
| 5,554,948 A | 9/1996 | Hansen et al. ............ 327/181 |
| 5,677,839 A | 10/1997 | Kondo |
| 5,701,089 A | 12/1997 | Perkins |
| 5,757,308 A | 5/1998 | Lissel et al. ............. 342/70 |
| 5,811,976 A | 9/1998 | Fischer |
| 5,812,429 A | 9/1998 | Downey et al. ........... 364/572 |
| 6,029,512 A * | 2/2000 | Suganuma et al. ........ 73/118.1 |
| 6,040,692 A | 3/2000 | Manlove et al. ........... 324/173 |
| 6,133,728 A | 10/2000 | Manlove et al. ........... 324/166 |
| 6,161,074 A | 12/2000 | Sielagoski et al. .......... 701/96 |
| 6,191,576 B1 | 2/2001 | Ricks et al. ............. 324/207.2 |

\* cited by examiner

ALTERNATOR TESTING METHOD AND SYSTEM USING RIPPLE DETECTION

RELATED APPLICATION

This application claims the benefit of priority from U.S. Provisional Patent Application Serial No. 60/214,254, entitled "AUTOMATIC ELECTRICAL SYSTEM TESTING APPARATUS AND METHODS," filed Jun. 26, 2000.

FIELD OF THE INVENTION

The invention relates generally to evaluation of alternator operation and, more specifically, to fault detection of an alternator based on the frequency of an alternator output signal.

BACKGROUND OF THE INVENTION

An alternator converts mechanical motions into alternating current (AC) by electromagnetic induction. The alternating current is then passed through a rectifier assembly, such as a full-wave rectifier bridge comprising diodes, to convert the AC into DC to power other electrical systems. For example, an alternator in an automotive vehicle is driven by the engine to power the vehicle's electrical system, such as for charging battery, powering headlights, and the like.

The output of an alternator, even though rectified, is not perfectly smooth. The waveform of an alternator output, after rectification, is generally a low-magnitude ripple riding on a DC component. An example of an alternator output signal of a three-phase alternator, after rectification, is shown in FIG. 1.

The rectifier assembly used in alternators comprises diodes. If one or more of the diodes fail, such as open or short-circuited, the alternator output waveform becomes considerably distorted. FIGS. 2a–2e show examples of alternator output waveforms when one or more diodes in the rectifier assembly fail. FIG. 2a is the output waveform of a normal alternator. FIG. 2b shows a waveform of an alternator having a short-circuited rectifying diode, FIG. 2c shows a waveform of an alternator having two short-circuited rectifying diodes, FIG. 2d shows a waveform of an alternator having one diode open-circuited, and FIG. 2e shows a waveform of an alternator having two diodes open. In any case, the distorted alternator output waveform is likely to damage the electrical system powered by the alternator. Accordingly, knowing whether an alternator and its rectifier assembly operate normally is important to alternator testing.

One way the operating condition of the diodes is determined is by disassembling the rectifier assembly and individually measuring each diode. This approach, however, is time-consuming and inefficient. Some alternator testers determine the health of an alternator by detecting the ripple amplitude of alternator output signals. The distorted ripple waveforms, as illustrated in FIGS. 2b to 2e, have amplitude larger than normal ripple waveforms shown in FIG. 2a. Some testers, therefore, pass the alternator output signal through a comparator having a preset threshold voltage A (See FIG. 3a). The comparator detects crossing of the threshold voltage by the ripple. The comparator outputs a logic state "1" when the ripple voltage is above the threshold voltage, and a logic state "0" when the ripple voltage is lower than the threshold voltage. For a normal output waveform, the ripple amplitude is always above threshold voltage A. Therefore, the output of the comparator is logic state "1." Conversely, if the rectifier assembly is defective, the ripple waveforms will be similar to those illustrated in FIGS. 2b to 2e and the valley voltage of the ripple will be lower than the threshold voltage A. A logic state "0" will appear on the output of the comparator indicating a defective alternator.

This approach, however, causes problems. The DC component of the alternator output, for reasons such as change of engine rotational speed, tends to float between different DC levels and thus the ripple voltage fluctuates accordingly. Since the threshold voltage is a fixed value, the level of the fluctuating waveform may drop below the threshold voltage (See FIG. 3b). Consequently, the comparator will indicate a defective alternator even if the rectifier assembly works well. Conversely, when the DC level rises above the threshold voltage, the output of the comparator is at logic "1" despite that one or more diodes may be defective. Under these circumstances, using ripple amplitudes to determine the health of the alternator is likely to produce errors.

Even if the engine rotational speed is stabilized during the test, the method using ripple amplitudes still causes problems. For instance, some vehicles are equipped with batteries located remotely from the alternator and connected to the alternator with long wires. The conducting wires spanning between the battery and the alternator have different impedance from those close to the alternator. This difference in impedance tend to affect the DC level of the alternator output signal and thus, as described above, creates incorrect test result.

SUMMARY OF THE INVENTION

Accordingly, there exists a need to efficiently determine the health of an alternator. There is also a need for determining the health of an alternator accurately. There is another need for evaluating the health of an alternator from the alternator output signal. An additional need exists for correctly determining the health of an alternator irrespective of the location of the battery. Still another need exists for an adaptive threshold to produce a correct waveform representing the frequency component of the alternator output signal.

The method according to the present invention comprises detecting a frequency component of the alternator output signal, comparing the frequency component of the alternator output signal with a threshold frequency, and evaluating the operation of the alternator based on a result of the comparison.

The system for evaluating the operation of an alternator per the invention comprises a terminal for receiving an alternator output signal representative of an output of the alternator, a frequency detection device for detecting a frequency component of the alternator output signal, a controller for comparing the frequency component of the alternator output signal to a threshold frequency and generating an indication signal based on a comparison result, and an indication device responsive to the content of the indication signal for indicating the operation of the alternator.

According to one aspect of the invention, the frequency detection device may comprise, for example, a threshold device for generating a reference threshold and a comparator for comparing the level of the alternator output signal with the reference threshold. The comparator produces a frequency signal representative of the frequency component of the alternator output signal. According to one aspect of the invention, the reference threshold may be generated based on the level of the alternator output signal according to a predetermined rule. The reference threshold may be a value between a peak signal level and a valley signal level of the alternator output signal. For example, the reference threshold may be the average of the peak signal level and the valley signal level.

According to an embodiment of the invention, a system for evaluating the operation of an alternator comprises a terminal for receiving an alternator output signal representative of an output of the alternator, an adaptive threshold device for generating a reference threshold based on the level of the alternator output signal according to a predetermined rule, and a comparator for comparing the level of the alternator output signal with the reference threshold and generating a frequency signal indicating the frequency component of the alternator output signal based on the comparison result. A controller, responsive to the frequency signal, compares the frequency component of the alternator output signal to a threshold frequency and generates an indication signal representative of the operation of the alternator based on the comparison result of the frequency component and the threshold frequency. An indication device responsive to the content of the indication signal indicates the operation of the alternator.

The method and system of the invention, using the frequency component of the alternator output signal to evaluate the health of an alternator, provide an efficient and precise indication of the operation of the alternator. False diagnosis is reduced, even as the DC level of the alternator output signal fluctuates.

Still other advantages and novel features of the present invention will be apparent from the following detailed description, simply by way of illustration of the invention and not limitation. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

The invention is illustrated by way of example, and not by way of limitation, in the figures of the accompanying drawings in which like reference numerals refer to similar elements and in which.

DESCRIPTION OF THE PREFERRED EMBODIMENT

For purpose of illustration, examples for providing a method and system for evaluating the operation of an alternator in an automotive vehicle will be described. In the following description, numerous specific details are set forth in order to provide a thorough understanding of the present invention. It will be apparent, however, to one skilled in the art that the invention may be practiced without these specific details. In other instances, well-known structures and devices are shown in block diagram form in order to avoid unnecessarily obscuring the present invention.

Figure 1:
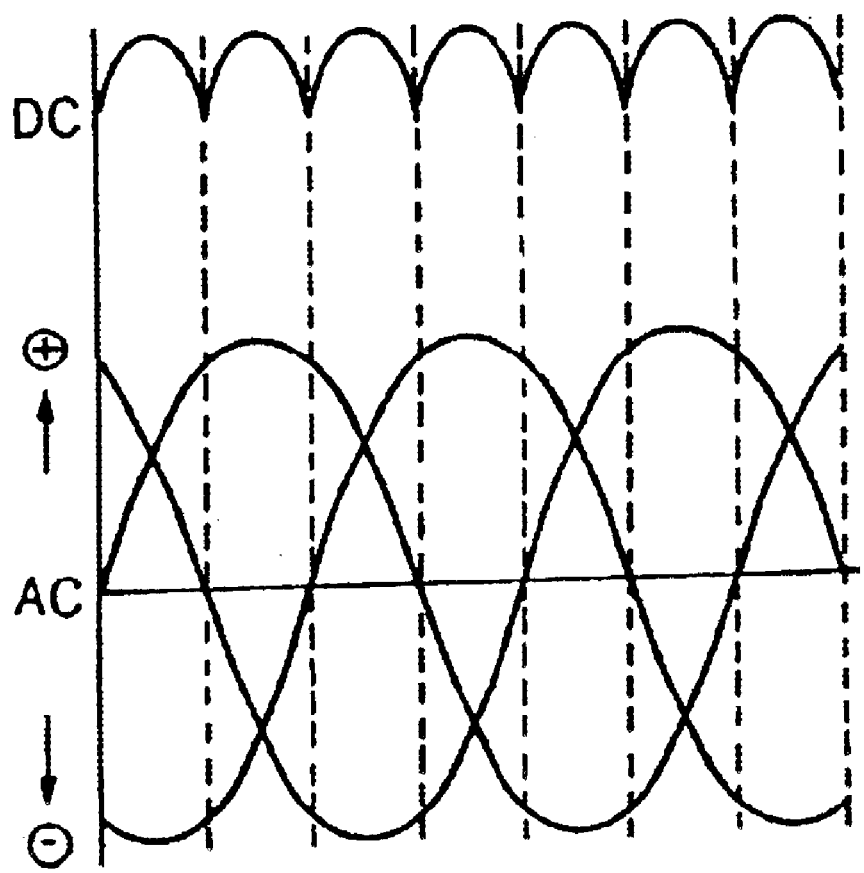
FIG. 1 illustrates an example waveform of an alternator output signal of a three-phase alternator after rectification.
Figure 2A:
FIGS. 2a–2e show examples of alternator output waveforms.
Figure 2B:
Figure 2D:
Figure 2C:
Figure 2E:
Figure 3A:
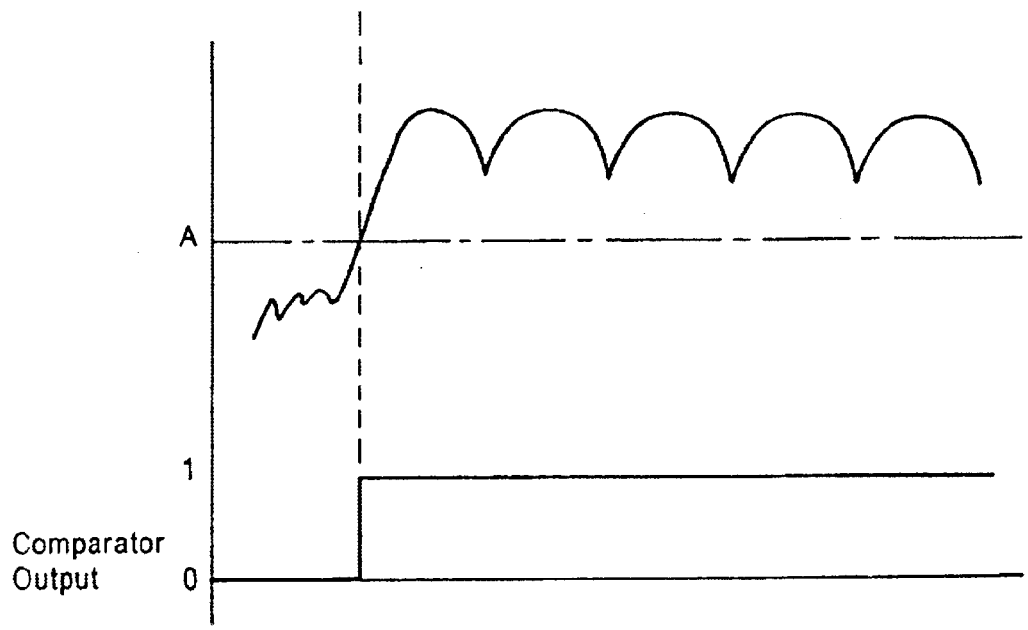
FIGS. 3a and 3b illustrate a comparator output using a fixed threshold voltage.
Figure 3B:
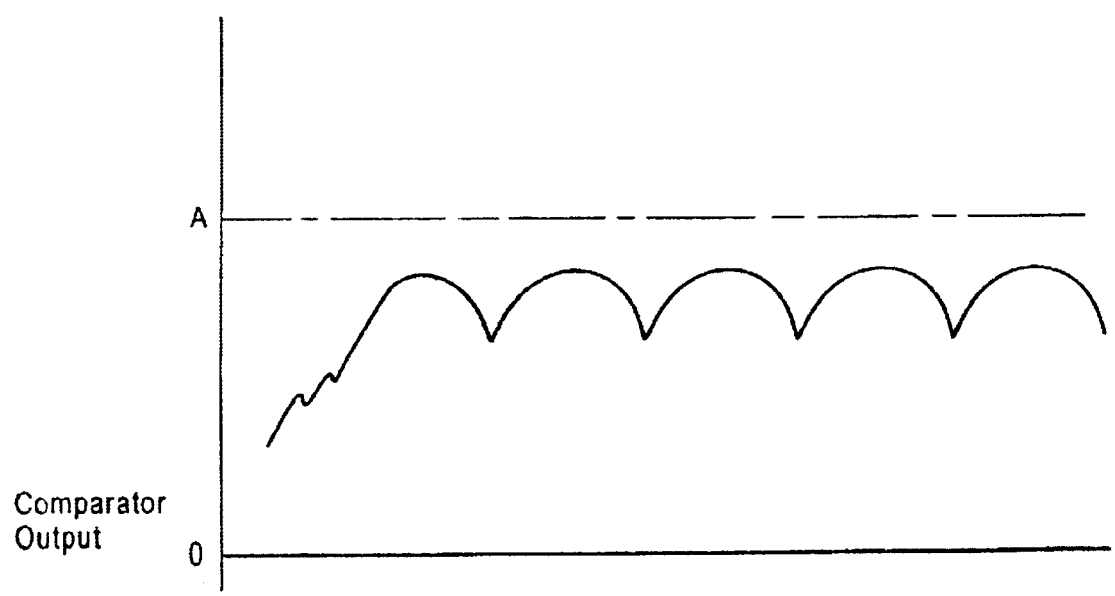

The output waveform of an alternator having a defective rectifier assembly, as shown in FIGS. 2b–2e, has a lower frequency compared to that of a healthy alternator shown in FIG. 2a, that is, an alternator that functions in the manner designed. A method and system implemented according to the present invention determine the health of an alternator based on the ripple frequency of the waveform. If the ripple frequency is lower than a threshold frequency, the alternator is determined as defective.

Figure 4:
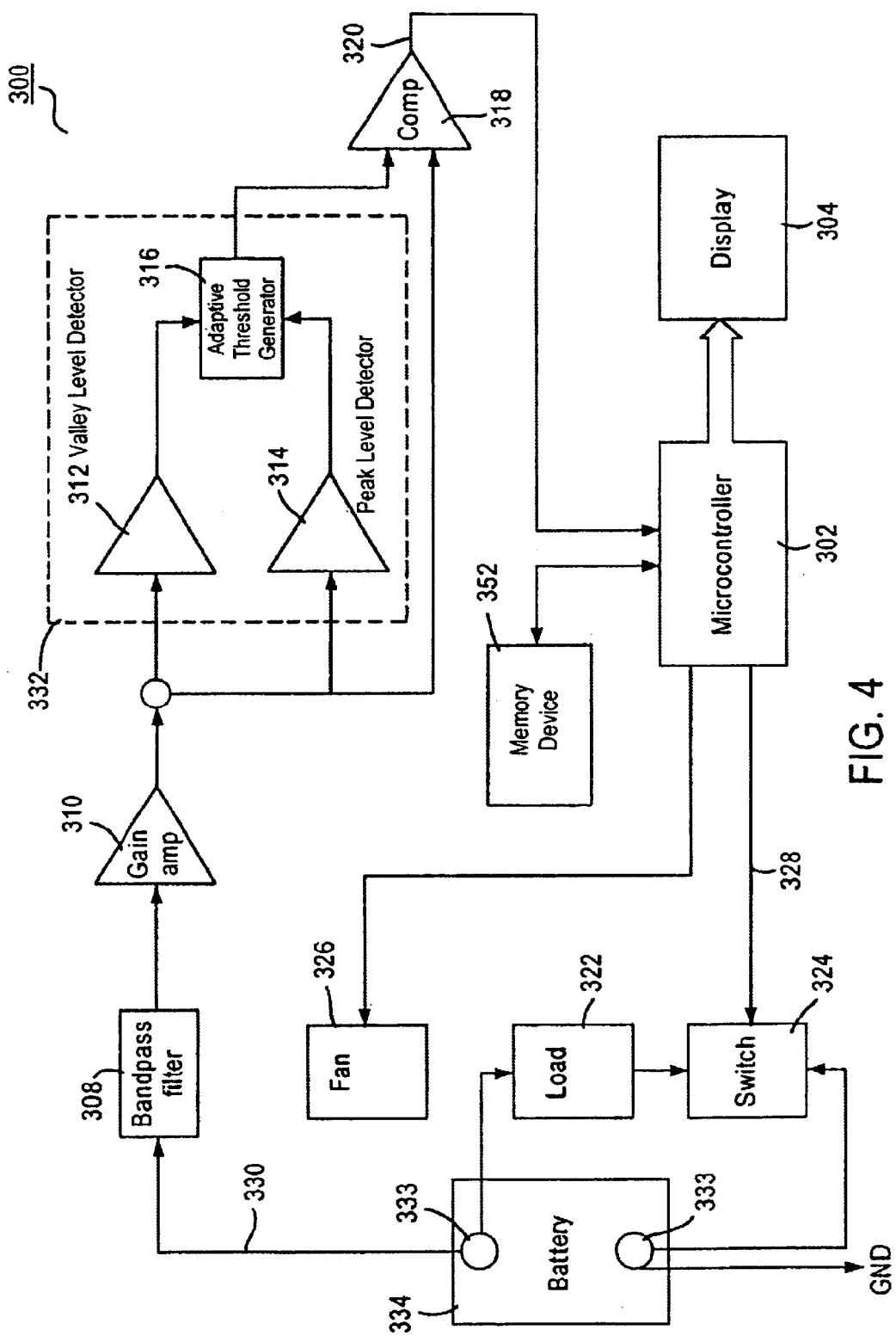
FIG. 4 is a block diagram of an alternator testing system implemented according to the present invention.

FIG. 4 shows a block diagram of an alternator testing system implemented according to the present invention. For purpose of illustration, the operation of the testing system is described with an alternator that charges a battery in an automotive vehicle. In an automotive vehicle, the alternator (not shown) is driven by the engine of the automotive vehicle (not shown) to generate electricity. The output of the alternator is coupled to battery 334 via a set of battery terminals 333.

Testing system 300 may have terminals for receiving an alternator output signal 330 representative of the output of the alternator. The alternator output signal may be the voltage and/or current generated by the alternator that charges battery 334. Alternatively, alternator output signal 330 may be a signal from an on-board vehicle computer or other testing equipment representative of the output of the alternator. In any case, alternator output signal 330, as discussed above, contains a signal component representative of the ripple of the alternator output.

In operation, testing system 300 may be directly coupled to the output terminal of the alternator for receiving alternator output signal 330, or alternatively, to the battery terminals to which the alternator is coupled. Alternatively, testing system 300 may use a signal plug to connect to an on-board computer for receiving an alternator output signal representative of the output of the alternator.

While the test may be conducted at any rotational speed of the alternator or the engine, the engine is preferably driven to a stable rotational speed, such as 1500 rpm, to ensure the alternator generates a stable alternator output signal to battery 334. As an alternative, the test may be conducted when the engine is at idle rotational speed.

Testing system 300 has a microcontroller 302 and a display 304. Microcontroller 302 processes data and generates control signals. Display 304 is means for providing a communication interface with a user and may be an LCD screen, a LED indicator or the like. Microcontroller 302 may control a switch device 324, such as an FET switch, that selectively couples a load 322 to the alternator, so that the alternator can be tested under load. Load 322 may be a Michrome coil or other resistive wire or the like, or other form of load that draws current from the alternator. Alternatively, load 322 may be provided by turning on electrical accessories of the vehicle, such as headlights, rear window defroster, or the like. As another alternative, the test may be conducted without externally coupling a load to the alternator if the battery draws large current from the alternator. A cooling fan 326, controlled by microcontroller 302, may be provided to help dissipate heat generated by load 322. Reference is herein made to copending application Ser. No. 09/888,382, by the same inventors filed concurrently herewith, titled ALTERNATOR TESTING METHOD AND SYSTEM USING TIMED APPLICATION OF LOAD, and commonly assigned, for description of these components.

During the test, microcontroller 302 generates a switch control signal 328 controlling switch 324 to couple load 322 to the alternator via the battery terminals. Since battery 334 is coupled to the alternator via battery terminals 333, the alternator is now operating under load and alternator output signal 330 is produced.

Alternator output signal 330 may first pass through a bandpass filter 308 in order to eliminate harmonics as well as noise picked up by battery terminals 333. Bandpass filter 308 may have a pass band between 100 Hz and 4 kHz. Alternator output signal 330 then passes through an amplifier 310 to amplify the signal level.

Alternator output signal 330 is then fed to an adaptive threshold circuit 332 and a comparator 318. Adaptive threshold circuit 332 generates an adaptive threshold, such as a reference voltage, for use in comparator 318. Comparator 318 generates a frequency signal 320 based on a comparison between the ripple signal levels and the adaptive threshold: If the ripple signal level in alternator output signal 330 is larger than the adaptive threshold, comparator 318 generates a logic "1;" if the ripple signal level in alternator output signal 330 is smaller than the adaptive threshold, comparator 318 generates a logic "0." Accordingly, the output of comparator 318 is similar to a clock signal indicating crossing of the adaptive threshold by the ripple component of alternator output signal 330. As known to persons skilled in the art, comparator 318 may use an inverse logic to indicate the comparison result.

Adaptive threshold circuit 332 may include a valley level detector 312, a peak level detector 314, and an adaptive threshold generator 316. Valley level detector 312 and peak level detector 314 detect signal levels, such as voltage, of the peak and valley of the ripple waveform and send the result to adaptive threshold generator 316. Adaptive threshold generator 316 generates an adaptive threshold that changes value as the peak and valley signal levels change. For example, the adaptive threshold may be the average of the peak signal level and the valley signal level, or other values that change with the inputs.

The use of adaptive threshold prevents inaccurate crossing reading caused by the varying DC level of the ripple. Since the level of an adaptive threshold is determined by the peak level and the valley level of alternator output signal 320, unlike a fixed threshold the adaptive threshold floats with the varying DC level of alternator output signal 320. The crossing of the adaptive threshold by the ripple thus reflects the variation of the ripple waveform more accurately. Although an adaptive threshold is used to illustrate the operation of the system, a fixed threshold may be used to reduce cost and design complexity.

As described above, comparator 318 generates a frequency signal 320 based on a comparison between the ripple voltage and the reference voltage. Since frequency signal 320 reflects the crossing of the reference signal level by the ripple waveform, the frequency signal 320 reflects the high frequency ripple contained in alternator output signal 330.

Frequency signal 320 may then passed to AD/DA converter (not shown) and then to microcontroller 302 for frequency analysis. Microcontroller 302 may calculate the frequency of frequency signal 320 by measuring the time period between each phase. Upon determination of the frequency, microcontroller 302 compares the ripple frequency with a threshold frequency to determine the health of the alternator.

The threshold frequency is derived from parameters of a healthy alternator, that is, an alternator having acceptable operating characteristics. For example, the threshold frequency may be determined based on the ripple frequency of a healthy alternator corresponding to a specific engine rotational speed. For an alternator used in an automotive vehicle, the ripple frequency of the alternator output signal is proportional to the alternator rotor rotational speed and the number of ripples per alternator rotor revolution. Since the alternator is usually driven by the vehicle engine, the alternator rotor rotational speed is proportional to the engine rotational speed. The relationship between the engine rotational speed and the alternator rotor rotational speed is $$\text{alternator rotor rotational speed} = \text{engine rotational speed} \cdot \text{pulley ratio},$$

wherein pulley ratio is the ratio between the crankshaft pulley diameter and alternator pulley diameter.

Since the ripple frequency of the alternator output signal is proportional to the number of ripples during one alternator rotor revolution and the alternator rotor rotational speed, the relationship between the ripple frequency and the alternator rotor rotational speed is:

$$\text{ripple frequency} = \text{alternator rotor rotational speed} \cdot k\_ripple,$$

wherein k_ripple is the number of ripples per rotor revolution.

Accordingly, the relationship between the ripple frequency and the engine rotational speed is:

$$\text{ripple frequency} = \text{engine rotational speed} \cdot \text{pulley ratio} \cdot k\_ripple$$

Since pulley ratio and k_ripple are both known constants for a specific vehicle model, the ripple frequency can be determined by observing the engine rotational speed. Hence, the ripple frequency of a healthy alternator corresponding to a specific engine rotational speed can be determined. In one embodiment, the threshold frequency may be empirically adjusted to address concerns like fault tolerance margins. For example, for a three-phase alternator, the threshold frequency may be set at 1700 Hz when the engine rotational speed is 1500 rpm, while the threshold frequency may be set at 500 Hz for an idle engine rotational speed (700–1000 rpm). A look-up table may be created for threshold frequencies corresponding to different engine rotational speeds or alternator rotational speeds.

If the alternator is tested under 1500 rpm engine rotational speed, microcontroller 302 will check if the frequency of frequency signal 320 is lower than 1700 Hz. If the frequency is lower than 1700 Hz, microcontroller 302 may generate an error signal to display 304 indicating existence of a defective alternator or rectifier assembly.

Figure 5:
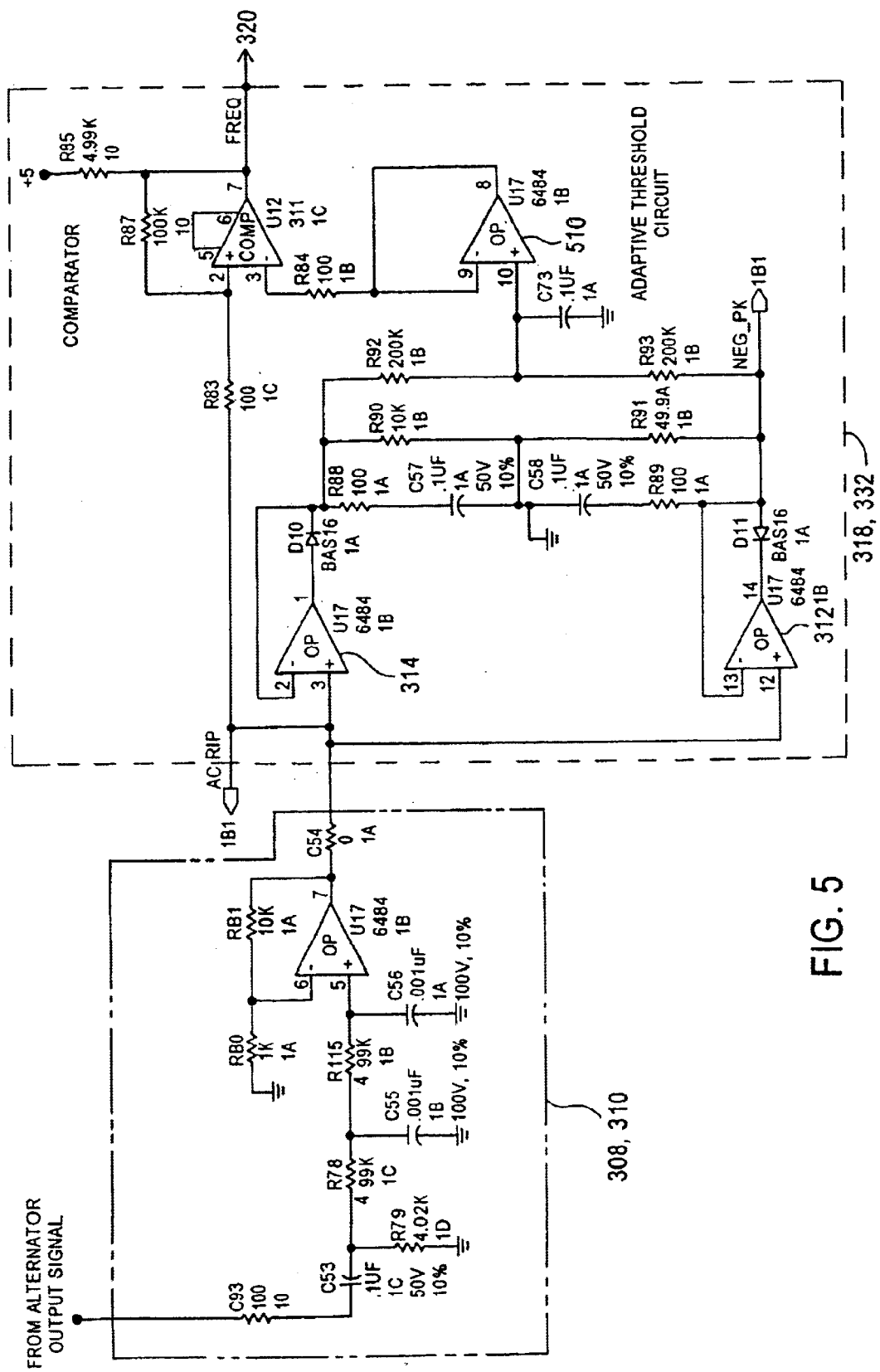
FIG. 5 shows an example circuit for the components used in an alternator testing system implemented according to the present invention.

FIG. 5 shows exemplary circuitry for bandpass filter 308, gain amplifier 310, comparator 318 and adaptive threshold circuit 332. The capacitors and resistors in block 308, 310 filter out unwanted frequency component due to noise or harmonics. Amplifier 312 is a valley level detector that detects valley voltage of the alternator output signal. Amplifier 314 is a peak level detector that detects peak voltage of the alternator output signal. Amplifier 510 generates a reference voltage based on the output of amplifier 312 and 314. Other designs known to persons skilled in the art may be used to implement the system.

Figure 6:
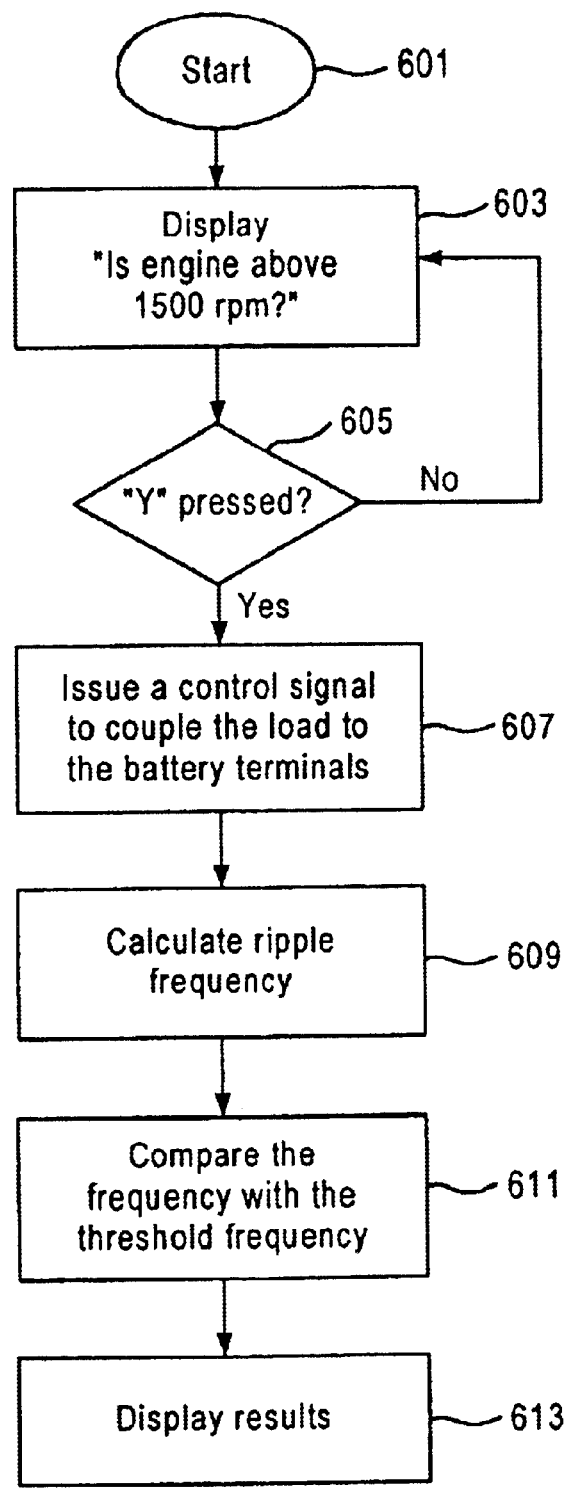
FIG. 6 is a flow chart illustrating the testing procedure of a vehicle alternator implemented according to the present invention.

FIG. 6 shows a flow chart illustrating the testing procedure of a vehicle alternator implemented according to the present invention. At step 603, microcontroller 302 generates a message asking the user to confirm if the rotational speed of the engine has reached 1500 rpm. The user can observe the engine rotational speed from a tachometer.

Alternatively, experienced users may determine the engine rotational speed based on the audible noise generated by the engine. Upon indication by the user that 1500 rpm is reached, microcontroller 302 issues a switch control signal 328 to control switch 324 to couple load 322 to the alternator via the battery terminals 333 (Steps 603–607). The alternator is now operating under load. After alternator output signal 330 enters the system, microcontroller 302 calculates the frequency of the ripple component of alternator output signal 330 (Step 609). At Step 611, microcontroller 302 compares the ripple frequency with the threshold frequency corresponding to 1500 rpm engine rotational speed. If, for example, the frequency is significantly lower than the threshold frequency, microcontroller 302 will generate an error message indicating the alternator under test is defective. Otherwise, a message indicating a normal alternator will be generated and displayed to the user (Step 613).

As another embodiment of the present invention, the testing system may receive a signal indicative of the engine rotational speed from another testing system, or, the present testing system may include a sensor for detecting the rotational speed of the engine. The reading of the rotational speed can be fed to microcontroller 302. With this information about the engine rotational speed, microcontroller 302 can conduct the test without feedback from the user. Consequently, steps 602 and 603 can be omitted.

A testing system implemented according to the present invention may optionally have a memory device 352, such as a flash memory, a diskette or the like, that includes a database containing threshold frequency data for different vehicle models and years. A message will prompt the user to identify the vehicle model and year under test. Microcontroller 302 will access the corresponding threshold frequency accordingly. Thus, the testing system can properly determine the operation of alternators installed in different vehicle models despite that the vehicles may use different types of alternator.

Although voltage waveforms are described in the examples for testing alternator output signals, other signal forms and medium can also be used, such as optical signals, digitized signals, or the like.

The embodiments described above may be used with any desired system or engine. Those systems or engines may comprise items utilizing fossil fuels, such as gasoline, natural gas, propane and the like, wind and hybrids or combinations thereof. Those systems or engines may be incorporated into another systems, such as an automobile, a truck, a boat or ship, a motorcycle, a generator, an airplane and the like. The embodiments may include or be utilized with any appropriate voltage level, such as about 12 Volts, about 42 Volts and the like.

While this invention has been described in connection with an exemplary embodiment, it is to be understood that the invention is not limited to the disclosed embodiment, but on the contrary, is intended to cover various modifications and equivalent arrangements included within the spirit and scope of the appended claims.

What is claimed is:

1. A method for evaluating operation of an alternator comprising:
   detecting a frequency component of an alternator output signal representative of a rectified output of the alternator;
   comparing the frequency component of the alternator output signal with a threshold frequency; and
   evaluating operation of a rectifying circuit of the alternator based on a result of the comparing step.

2. The method of claim 1, further comprising a step of maintaining the rotational speed of the alternator at a predetermined level before detecting the frequency component of the alternator output signal.

3. The method of claim 1, further comprising the step of:
   responsive to the frequency component being smaller than the threshold frequency, generating an error signal to indicate a defective rectifying circuit.

4. A system for evaluating the operation of an alternator comprising:
   a terminal for receiving an alternator output signal representative of a rectified output of the alternator;
   a frequency detection device for detecting a frequency component of the alternator output signal;
   a controller for comparing the frequency component of the alternator output signal to a threshold frequency, and generating an indication signal based a result of the comparison; and
   an indication device responsive to the content of the indication signal for indicating the operation of a rectifying circuit of the alternator.

5. The system of claim 4, wherein the frequency detection device comprises:
   a threshold device for generating a reference threshold; and a comparator for comparing the level of the alternator output signal with the reference threshold and generating a frequency signal indicating the frequency component of the alternator output signal based on the comparison result;
   wherein the frequency signal is coupled to the controller.

6. The system of claim 5, wherein the reference threshold is generated based on the level of the alternator output signal according to a predetermined rule.

7. The system of claim 6, wherein the reference threshold is a value between a peak signal level and a valley signal level of the alternator output signal.

8. The system of claim 6, wherein the reference threshold is the average of the peak level and valley level of the alternator output signal.

9. The system of claim 4, wherein the alternator output signal is the current or voltage generated by the alternator.

10. The system of claim 4, wherein the alternator is installed in an automotive vehicle and driven by the engine of the automotive vehicle.

11. The system of claim 10, further comprising a database, accessible by the controller, including threshold frequencies corresponding to more than one vehicle model.

12. The system of claim 10, further comprising a database, accessible by the controller, including threshold frequencies corresponding to more that one engine rotational speed.

13. The system of claim 10, wherein the alternator output signal is received from a vehicle computer installed on the automotive vehicle.

14. The system of claim 4, further comprising a database, accessible by the controller, including threshold frequencies corresponding to more than one alternator rotational speed.

15. The system of claim 4, wherein the alternator output signal is received from a data processing system.

16. A system for evaluating the operation of an alternator comprising:
   a terminal for receiving an alternator output signal representative of an output of the alternator;
   an adaptive threshold device for generating a reference threshold based on the level of the alternator output signal according to a predetermined rule;

a comparator for comparing the level of the alternator output signal with the reference threshold and generating a frequency signal indicating the frequency component of the alternator output signal based on the comparison result;

a controller for comparing the frequency component of the alternator output signal with a threshold frequency, and generating an indication signal representative of the operation of the alternator based on the comparison result of the frequency component and the threshold frequency; and an indication device responsive to the content of the indication signal for indicating the operation of the alternator.

17. The system of claim 16, wherein the reference threshold is the average of the peak level and valley level of the alternator output signal.

18. A system for evaluating the operation of an alternator comprising:

means for receiving an alternator output signal representative of a rectified output of the alternator;

means for detecting a frequency component of the alternator output signal;

means for comparing the frequency component of the alternator output signal to a threshold frequency;

means for generating an indication signal based the comparison result; and an indication device responsive to the content of the indication signal for indicating the operation of a rectifying circuit of the alternator.

19. The system of claim 18, wherein means for detecting a frequency component of the alternator output signal comprises:

means for generating a reference threshold; and means for comparing the level of the alternator output signal with the reference threshold and generating a frequency signal indicating the frequency component of the alternator output signal based on the comparison result;

wherein the frequency signal is coupled to the controller.

20. The system of claim 19, wherein the reference threshold is generated based on the level of the alternator output signal according to a predetermined rule.

21. The system of claim 20, wherein the reference threshold is a value between a peak signal level and a valley signal level of the alternator output signal.

22. The system of claim 21, wherein the reference threshold is the average of the peak level and valley level of the alternator output signal.

23. A system for evaluating the operation of an alternator comprising:

means for receiving an alternator output signal representative of an output of the alternator;

means for generating a reference threshold based on the level of the alternator output signal according to a predetermined rule;

means for comparing the level of the alternator output signal with the reference threshold and generating a frequency signal indicating the frequency component of the alternator output signal based on the comparison result;

means for comparing the frequency component of the alternator output signal with a threshold frequency, and generating an indication signal representative of the operation of the alternator based on the comparison result of the frequency component and the threshold frequency; and indication means, responsive to the content of the indication signal, for indicating the operation of the alternator.

24. The system of claim 23, wherein the reference threshold is the average of the peak level and valley level of the alternator output signal.

25. A method for evaluating operation of an alternator comprising:

detecting a frequency component of an alternator output signal representative of a rectified output of the alternator obtained from terminals of a battery coupled to the alternator;

comparing the frequency component of the alternator output signal with a threshold frequency; and evaluating operation of the alternator based on a result of the comparing step.

26. The method of claim 25 further generating an output signal indicating the operation of a rectifying circuit of the alternator based on a result of the evaluating step.

27. A system for evaluating the operation of an alternator comprising:

a terminal for receiving an alternator output signal representative of a rectified output of the alternator from terminals of a battery coupled to the alternator;

a frequency detection device for detecting a frequency component of the alternator output signal;

a controller for comparing the frequency component of the alternator output signal to a threshold frequency, and generating an indication signal based a result of the comparison; and an indication device responsive to the content of the indication signal for indicating the operation of the alternator.

28. The system of claim 27 wherein the operation of the alternator is related to a rectifying circuit of the alternator.

29. A system for evaluating the operation of an alternator comprising:

means for receiving an alternator output signal representative of a rectified output of the alternator from terminals of a battery coupled to the alternator;

means for detecting a frequency component of the alternator output signal;

means for comparing the frequency component of the alternator output signal to a threshold frequency;

means for generating an indication signal based the comparison result; and an indication device responsive to the content of the indication signal for indicating the operation of the alternator.

30. The system of claim 29, wherein the operation of the alternator is related to a rectifying circuit of the alternator.

* * * * *